United States Patent
Geiss et al.

(10) Patent No.: US 7,625,792 B2
(45) Date of Patent: Dec. 1, 2009

(54) METHOD OF BASE FORMATION IN A BICMOS PROCESS

(75) Inventors: Peter J. Geiss, Underhill, VT (US);
Alvin J. Joseph, Williston, VT (US);
Qizhi Liu, Essex Junction, VT (US);
Bradley A. Orner, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/599,938

(22) PCT Filed: Apr. 6, 2005

(86) PCT No.: PCT/US2005/011711

§ 371 (c)(1),
(2), (4) Date: Oct. 13, 2006

(87) PCT Pub. No.: WO2005/104680

PCT Pub. Date: Nov. 10, 2005

(65) Prior Publication Data

US 2007/0207567 A1    Sep. 6, 2007

(51) Int. Cl.
*H01L 21/8238* (2006.01)

(52) U.S. Cl. ............... 438/202; 438/234; 257/E21.382

(58) Field of Classification Search ............ None
See application file for complete search history.

(56) References Cited

U.S. PATENT DOCUMENTS

| | | |
|---|---|---|
| 4,682,409 A | 7/1987 | Thomas et al. |
| 4,808,548 A | 2/1989 | Thomas et al. |
| 5,017,990 A | 5/1991 | Chen et al. |
| 5,106,767 A | 4/1992 | Comfort et al. |
| 5,107,321 A | 4/1992 | Ilderem et al. |
| 5,144,403 A | 9/1992 | Chiang et al. |
| 5,290,716 A | 3/1994 | Nakamura et al. |
| 5,439,833 A | 8/1995 | Hebert et al. |
| 5,580,798 A | 12/1996 | Grubisich |
| 5,599,723 A | 2/1997 | Sato |
| 5,607,866 A | 3/1997 | Sato et al. |
| 5,661,046 A | 8/1997 | Ilderem et al. |
| 5,854,097 A | 12/1998 | Ohmi et al. |
| 5,940,711 A | 8/1999 | Zambrano |
| 5,953,600 A | 9/1999 | Gris |

(Continued)

FOREIGN PATENT DOCUMENTS

WO    WO 99/52138    10/1999

(Continued)

OTHER PUBLICATIONS

European Search Report dated Sep. 22, 2008 for EP Application No. 05736453.1 filed on Apr. 6, 2005.

*Primary Examiner*—Evan Pert
*Assistant Examiner*—Scott R Wilson
(74) *Attorney, Agent, or Firm*—Anthony J. Canale

(57) ABSTRACT

Disclosed is a bipolar complementary metal oxide semiconductor (BiCMOS) or NPN/PNP device that has a collector, an intrinsic base above the collector, shallow trench isolation regions adjacent the collector, a raised extrinsic base above the intrinsic base, a T-shaped emitter above the extrinsic base, spacers adjacent the emitter, and a silicide layer that is separated from the emitter by the spacers.

14 Claims, 5 Drawing Sheets

U.S. PATENT DOCUMENTS

| | | |
|---|---|---|
| 5,986,323 A | 11/1999 | Zambrano et al. |
| 5,986,326 A * | 11/1999 | Kato .......................... 257/593 |
| 6,028,345 A | 2/2000 | Johnson |
| 6,316,818 B1 | 11/2001 | Marty et al. |
| 6,465,317 B2 | 10/2002 | Marty |
| 6,492,238 B1 | 12/2002 | Ahlgren et al. |

FOREIGN PATENT DOCUMENTS

WO PCT/US2005/011711 4/2005

* cited by examiner

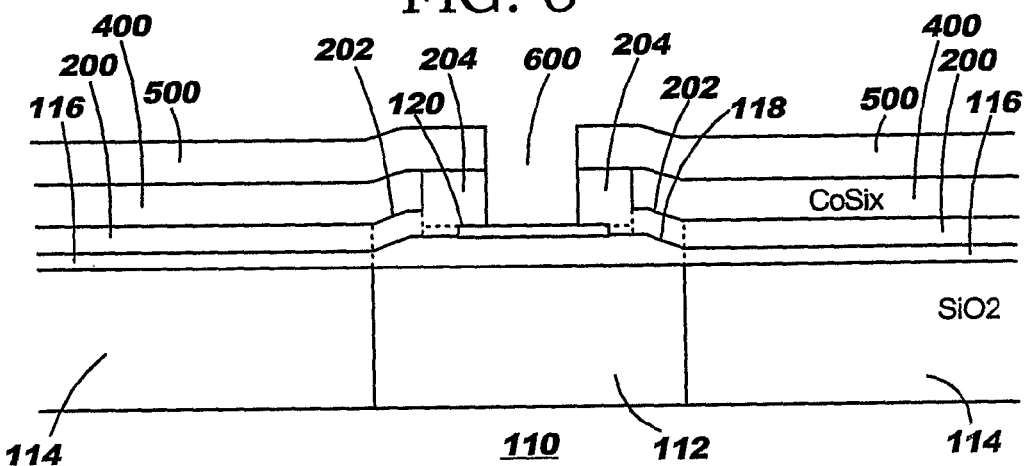
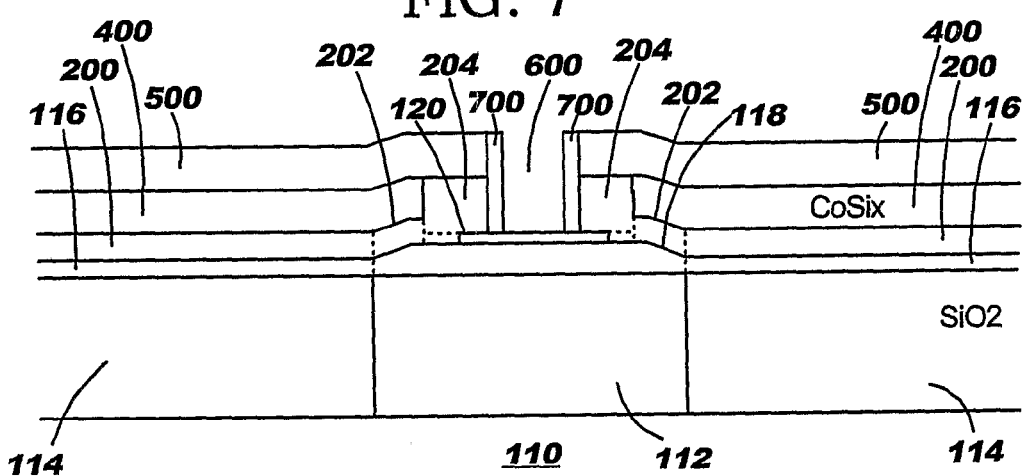
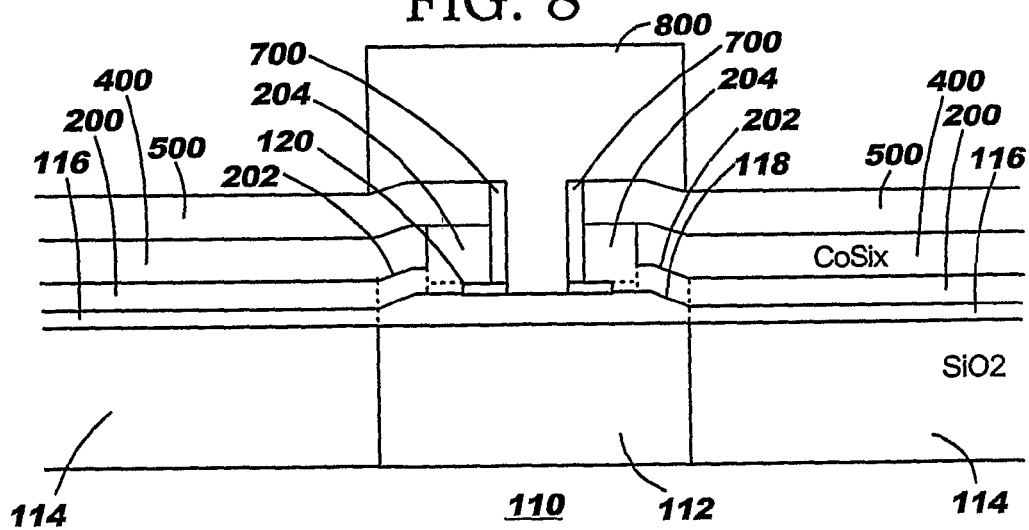

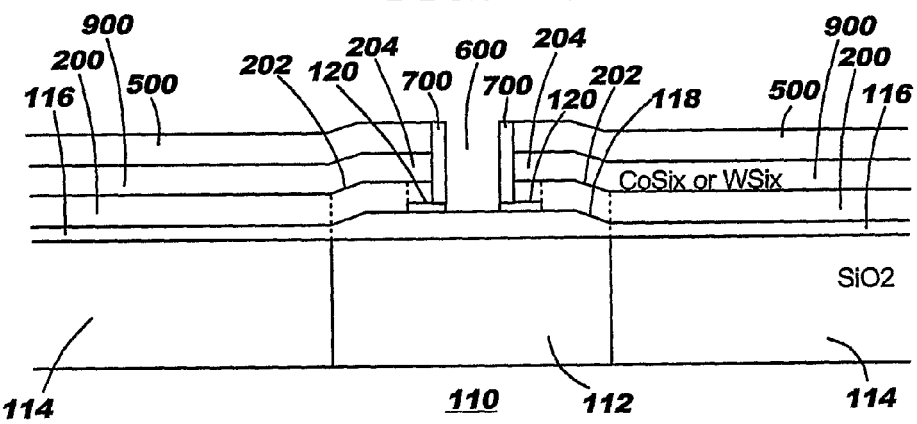
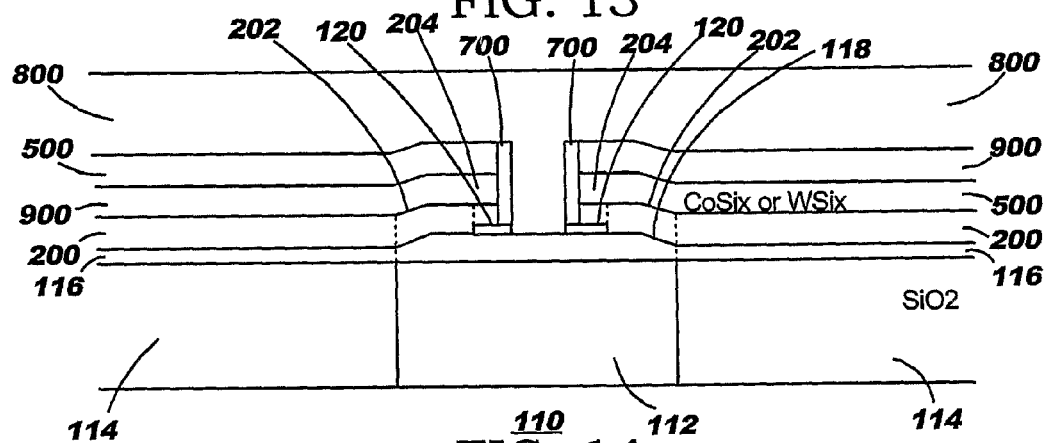
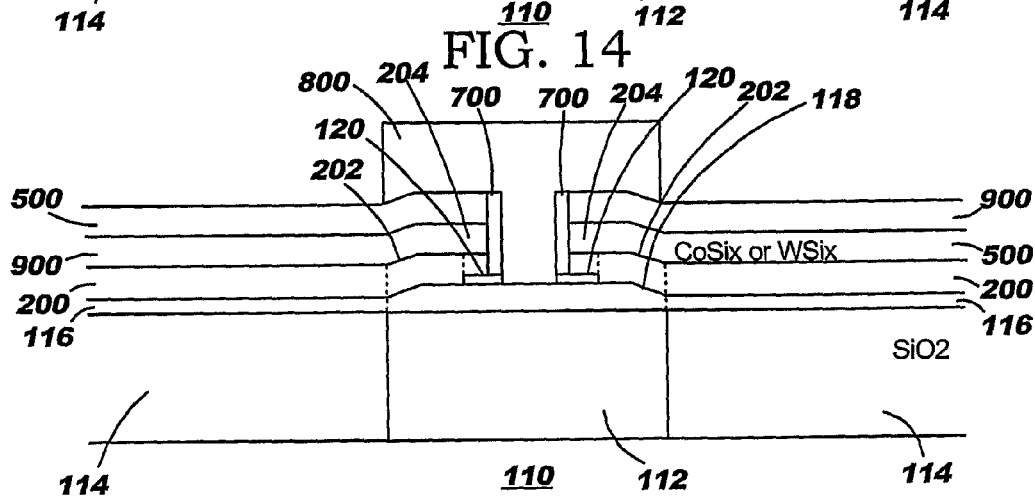

METHOD OF BASE FORMATION IN A BICMOS PROCESS

CROSS-REFERENCE TO RELATED APPLICATION

This application is a national stage entry of a prior application serial no. PCT/US05/11711, filed on Apr. 6, 2005.

TECHNICAL FIELD

The present invention generally relates to bipolar complementary metal oxide semiconductor (BiCMOS) and PNP/NPN devices and more particularly to an improved device that uses a silicon layer and spacers to separate the emitter from a silicided portion of the structure.

BACKGROUND ART

As the size of transistors continues to decrease, the resistance of the elements used within the smaller devices becomes more important. For example, the resistance of the base in bipolar complementary metal oxide semiconductor (BiCMOS) and PNP/NPN devices dramatically affects the performance of the devices.

SUMMARY OF THE INVENTION

This application discloses a method of making bipolar complementary metal oxide semiconductor (BiCMOS) devices. The invention forms a collector and an intrinsic base above the collector. Shallow trench isolation regions are formed adjacent the intrinsic base, and a raised extrinsic base is formed above the intrinsic base. The invention protects a portion of the extrinsic base using a sacrificial mask that is positioned over the center of the extrinsic base. The invention silicides exposed portions of the extrinsic base. This siliciding process leaves a non-silicided portion of the extrinsic base over the center of the intrinsic base. Next, the invention forms an emitter opening through a center of the non-silicided portion of the extrinsic base, forms insulating spacers in the emitter opening, and then forms an emitter in the emitter opening. Before forming the emitter opening, the invention forms an insulator layer above the extrinsic base, wherein the emitter opening is formed through the insulator layer. The spacers separate the emitter from silicided portions of the extrinsic base.

Before forming the extrinsic base, the invention patterns an insulator over the center of the intrinsic base and epitaxially grows the extrinsic base over the insulator and the intrinsic base. This process of epitaxially growing the extrinsic base grows polysilicon above the insulator and singie crystal silicon above the exposed portions of the intrinsic base. Further, the siliciding process forms the silicided portions of the extrinsic base horizontally adjacent to the non-silicided portion. The spacers in the emitter opening are formed on this insulator.

This produces a bipolar transistor in bipolar complementary metal oxide semiconductor (BiCMOS) technologies or bipolar-only technologies that has a collector, an intrinsic base above the collector, a raised extrinsic base above the intrinsic base on the sides, an emitter above the intrinsic base; wherein the emitter has a T-shape with a lower section and an upper section that is wider than the lower section, spacers adjacent the lower section of the emitter and an isolation layer beneath the upper section of the emitter, and a silicide layer adjacent the spacers and beneath the upper section of the emitter.

This structure includes a dielectric structure over the base and beneath the spacers, where the base is wider than the dielectric structure. The spacers separate the emitter from the extrinsic base and comprise insulators. Because it is self-aligned, the silicide is called a salicide.

The invention also includes a method of making a NPN or PNP transistor. This method forms a lower semiconductor structure having a first-type impurity (e.g., P-type) and a middle semiconductor region above the lower semiconductor structure. The middle semiconductor region has a second-type impurity (e.g., N-type) complementary to the first-type impurity.

This method protects a portion of the middle semiconductor structure using a sacrificial mask that is positioned over a center of the middle semiconductor region and silicides exposed portions of the middle semiconductor structure. The siliciding process leaves a non-silicided portion of the middle semiconductor structure over the center of the middle semiconductor region.

Next, this process forms an upper semiconductor structure opening through a center of the non-silicided portion of the middle semiconductor region, forms spacers in the upper semiconductor structure opening, and forms a T-shaped upper semiconductor structure in the upper semiconductor structure opening. The spacers separate the upper semiconductor structure from silicided portions of the middle semiconductor region.

The NPN or PNP transistor produced by this process includes a lower semiconductor structure having a first-type impurity, a middle semiconductor region above the lower semiconductor structure (the middle semiconductor region has a second-type impurity complementary to the first-type impurity), and a T-shaped upper semiconductor structure above the middle semiconductor region. The upper semiconductor structure also has the first-type impurity.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which:

FIG. 6 is a schematic diagram of a partially completed structure according to the invention;

FIG. 7 is a schematic diagram of a partially completed structure according to the invention;

FIG. 8 is a schematic diagram of a partially completed structure according to the invention;

FIG. 12 is a schematic diagram of a partially completed structure according to the invention;

FIG. 13 is a schematic diagram of a partially completed structure according to the invention; and FIG. 14 is a schematic diagram of a partially completed structure according to the invention.

DESCRIPTION OF THE INVENTION

Figure 1:
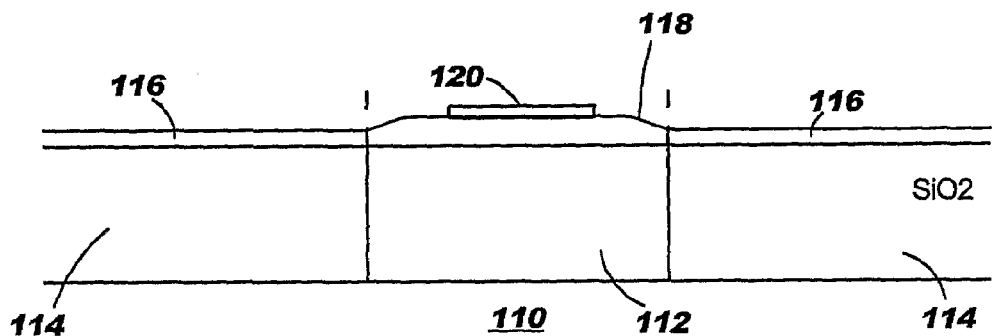
FIG. 1 is a schematic diagram of a partially completed structure according to the invention.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As mentioned above, the resistance of the base in bipolar PNP/NPN devices in bipolar complementary metal oxide semiconductor (BiCMOS) technologies or in bipolar-only technologies dramatically affects the performance of the devices. The invention described below provides a silicide layer adjacent the intrinsic base using a unique structure and methodology to address these issues. More specifically, as shown in FIGS. 1-8, the invention discloses a method of making bipolar complementary metal oxide semiconductor (BiCMOS) devices and PNP/NPN transistors.

As shown in FIG. 1, the invention forms an intrinsic base layer 116, 118 above a substrate layer 110 that includes a collector 112, and shallow trench isolation (STI) regions 114 (such as $SiO_2$ or other similar isolation materials) formed adjacent the collector 112. Region 116 is above STI region 114 and is polycrystalline. Region 118 is above region 112 and is single crystalline. There is a facet between region 116 and 118 known to those skilled in the art. A raised extrinsic base 200, 202 is formed above the intrinsic base layer 116, 118 through an epitaxial growth process. The epitaxial growth process maintains the crystal structure of the underlying intrinsic base 118 in the extrinsic regions 202. Therefore, if the intrinsic base 118 is single crystal silicon, the extrinsic base 202 will also be single crystal silicon. Note that the intrinsic base 118 portion that is grown over the collector 112 sees a faster growth rate than the polysilicon 116 that is grown over the insulator 114. Therefore, the single crystal intrinsic base 118 is raised above the corresponding polysilicon regions 116.

In addition, a landing pad insulator 120 is patterned on the center of the intrinsic base 118. The insulator 120 can comprise any conventional insulator such as silicon dioxide, silicon nitride, etc., or a stack of the combinations of these layers. The film stack can also have a poly or amorphous Si layer as the topmost layer. Further, the insulator 120 is narrower than the intrinsic base 118 width, but wider than the opening that will be formed for the emitter at later steps.

Figure 2:
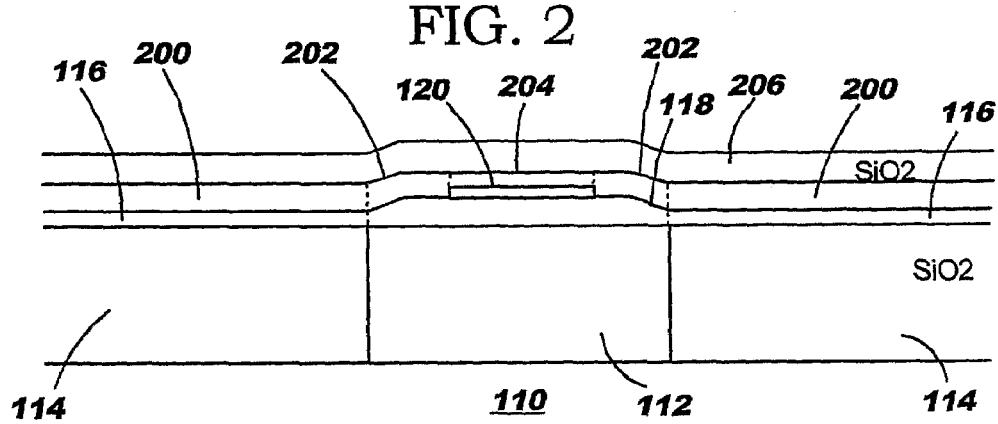
FIG. 2 is a schematic diagram of a partially completed structure according to the invention.

As shown in FIG. 2, a silicon layer that is the extrinsic base 200, 202 is formed above region 116 during intrinsic base growth. This silicon layer 200 is also formed in an epitaxial growth process. Therefore, regions of the extrinsic base 200 grown above the polysilicon intrinsic base 116 will comprise additional polysilicon. The regions of the extrinsic base 202 grown above the single crystal silicon 118 will also comprise single crystal silicon. To the contrary, the region of the extrinsic base 204 grown above the insulator 120 comprises polysilicon. Note that the width of the insulator 120 determines the width of the raised polysilicon portion 204 of the extrinsic base.

Figure 3:
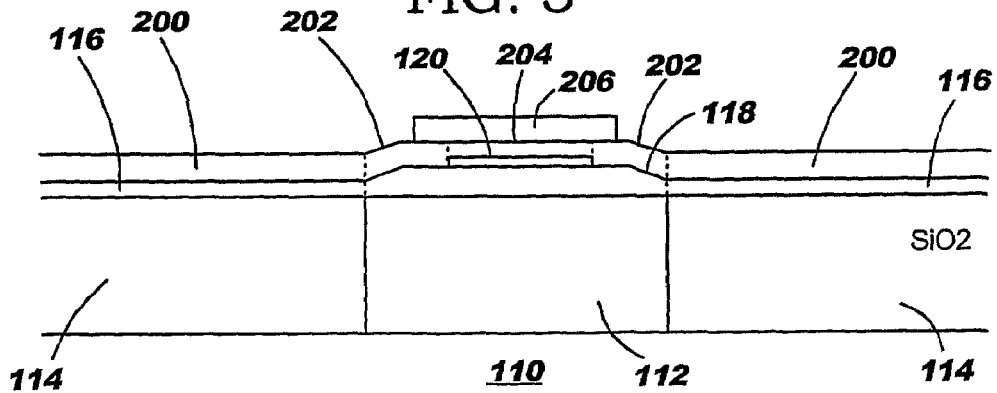
FIG. 3 is a schematic diagram of a partially completed structure according to the invention.

The invention protects a portion of the extrinsic base 200 using a sacrificial mask 206 that is patterned over the center of the extrinsic base 204. This mask layer can be an oxide layer, a nitride layer, an oxynitride layer, or a combination of these insulating layers. FIG. 2 illustrates the deposition of the sacrificial mask 206 and FIG. 3 illustrates the mask 206 after patterning.

Figure 4:
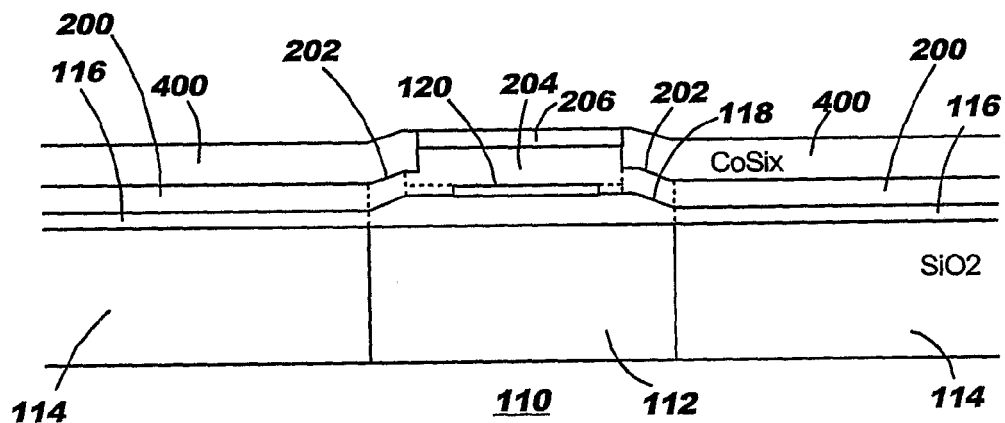
FIG. 4 is a schematic diagram of a partially completed structure according to the invention.

As shown FIG. 4, the invention silicides exposed portions of the extrinsic base 200, 202 that are not protected by the sacrificial mask 206. More specifically, the invention sputters metals such as cobalt, titanium, nickel, niobium, etc. over the structure and heats the structure to form the silicide 400. This layer 400 is actually a salicide because it is self-aligned. This siliciding process leaves a non-silicided portion of the extrinsic base 204 over the center of the intrinsic base 118 and over regions on the wafer other than the extrinsic base regions of the bipolar npn or pnp devices. This process also consumes a portion of the silicon 200, 202, thereby forming the silicide 400 horizontally (laterally) adjacent to the non-silicided silicon 204 and raising region 204 further with respect to regions 200, 202. The excessive metal and mask 206 is then removed.

Figure 5:
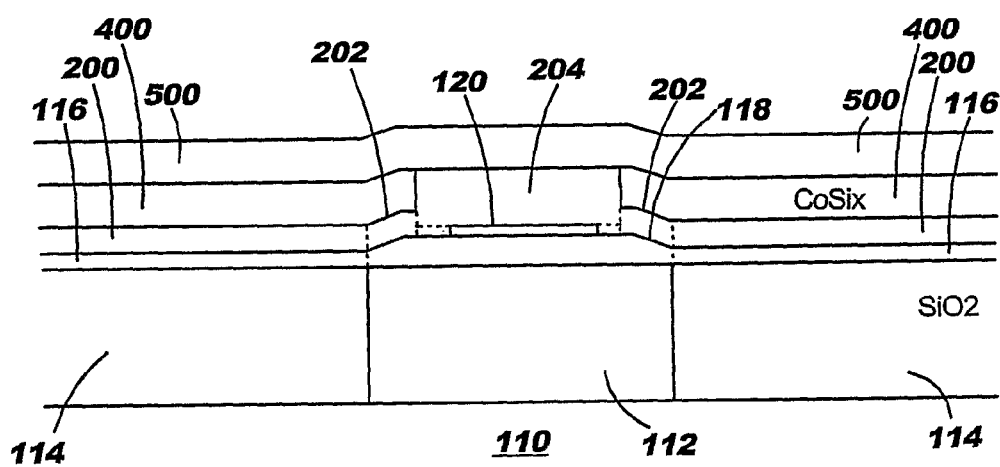
FIG. 5 is a schematic diagram of a partially completed structure according to the invention.

Before forming the emitter opening, as shown in FIG. 5, the invention forms an insulator layer 500 (e.g., TEOS, etc.) above the extrinsic base. Then, as shown in FIG. 6, the invention etches an opening 600 for the emitter. Thus, this process forms the emitter opening 600 through the center of the non-silicided portion of the extrinsic base 204 down to the insulator 120.

Next, as shown in FIG. 7, the invention forms spacers 700 (e.g., nitride, etc.) in the emitter opening 600 along the sidewalls of the non-silicided silicon 204. Next, the emitter opening 600 is extended through the insulator 204 to expose the upper portion of the intrinsic base 118. Following this, the invention forms an emitter 800 in the emitter opening 600. After further processing steps known to those skilled in the art, the final emitter has T-shape. One feature of this aspect of the invention is that the non-silicided portion of the extrinsic base 204 and the spacers 700 separate the emitter 800 from the silicide regions 400.

This produces a bipolar device that has a collector 112, an intrinsic base 118 above the collector 112, a raised extrinsic base 202 above and on the sides of the intrinsic base, and an emitter 800 above the intrinsic base 118. The emitter 800 has a T-shape with a lower section and an upper section that is wider than the lower section. The spacers 700 are adjacent the lower section of the emitter and beneath the upper section of the emitter, and the silicided portion of the extrinsic base 202 is adjacent the spacers and beneath the upper section of the emitter.

This structure includes a dielectric structure 120 over the base 118 and beneath the spacers 700, where the base 118 is wider than the dielectric structure 120. The spacers 700 separate the emitter 800 from the silicide and comprise insulators. Because it is self-aligned, the silicide is called a salicide.

While the foregoing process is described with respect to an NPN device in a BiCMOS technology or a bipolar-only technology, it is equally applicable to a PNP device. In such a structure, FIGS. 1-8 illustrate a lower semiconductor structure 112 having a first-type impurity, a middle semiconductor region 118 above the lower semiconductor structure 112 (the middle semiconductor region has a second-type impurity complementary to the first-type impurity), and a T-shaped upper semiconductor structure 800 above the middle semiconductor region 112, 118. The upper semiconductor structure 800 also has the first-type impurity. This structure also includes spacers 700 adjacent the upper semiconductor structure 800. Again, one feature of this structure is that the non-silicided portion of the middle semiconductor region 204 and the spacers 700 separate the upper semiconductor region 800 from the silicide regions 400.

Figure 9:
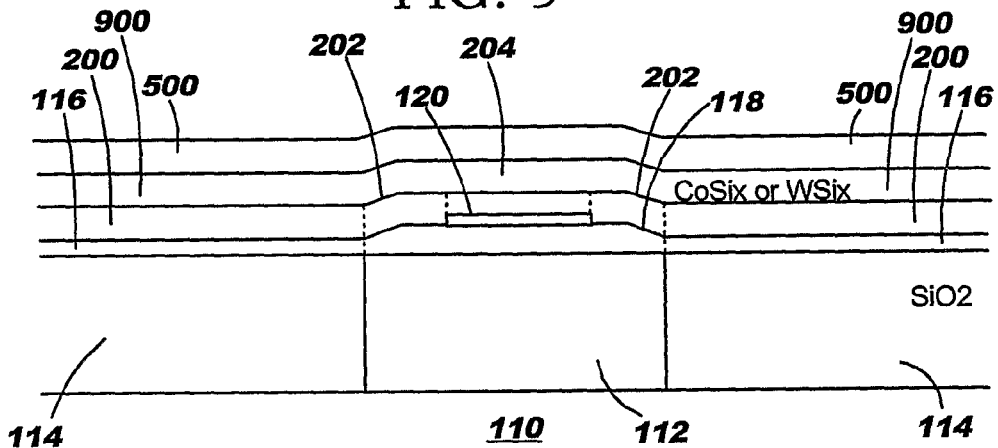
FIG. 9 is a schematic diagram of a partially completed structure according to the invention.
Figure 10:
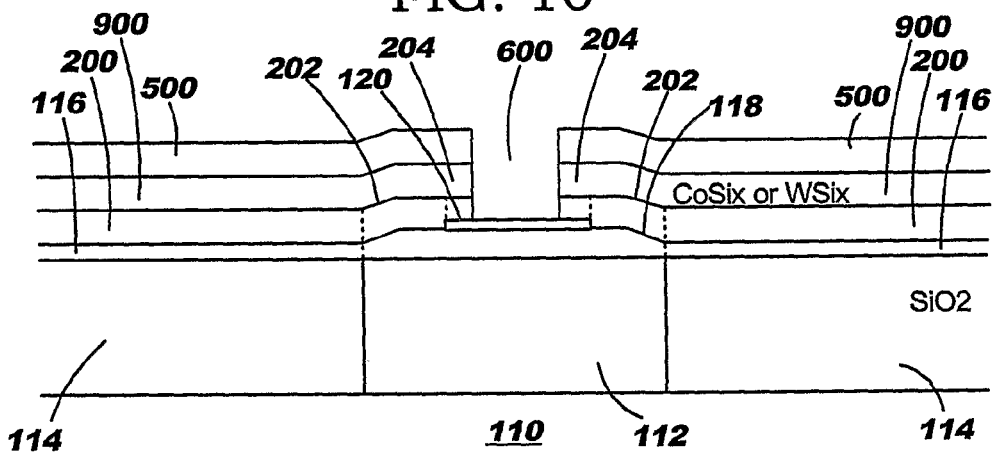
FIG. 10 is a schematic diagram of a partially completed structure according to the invention.
Figure 11:
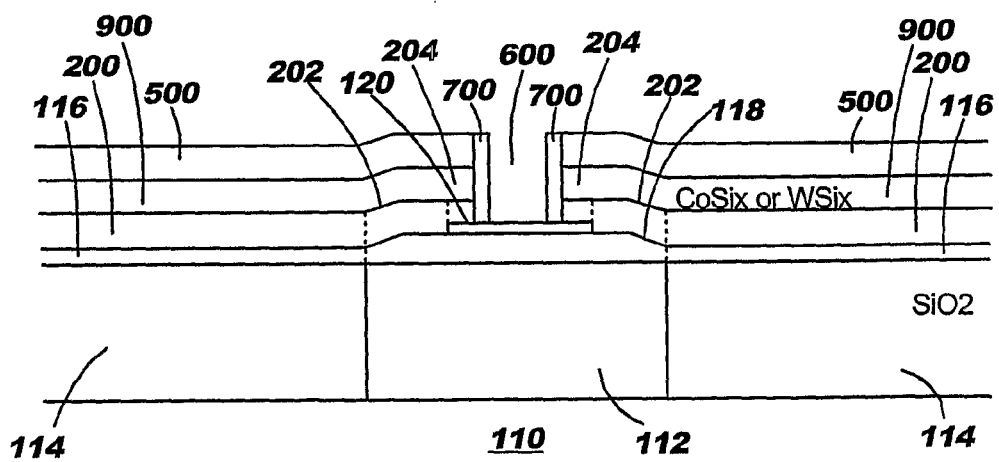
FIG. 11 is a schematic diagram of a partially completed structure according to the invention.

FIGS. 9-14 illustrate an additional embodiment of the invention that is somewhat similar to the previous embodiment. The same features discussed above are identified with the same reference numbers and a redundant discussion of the same is avoided. Therefore, only the differences between the previous embodiment and the additional embodiment are discussed herein. More specifically, as shown in FIG. 9, this embodiment omits the need to utilize the mask 206 while performing the silicide process. Therefore, the silicide layer 900 is continuous across all portions of the extrinsic base 200, 202, 204. FIG. 10 illustrates the formation of the emitter opening 600. FIG. 11 illustrates the formation of the spacers 700. FIG. 12 illustrates the extension of the emitter opening 600 through the insulator 120. FIG. 13 illustrates the deposition of the emitter material 800 and FIG. 14 illustrates the patterning of the emitter material 800 to form the T-shaped emitter.

Both embodiments discussed above reduce device resistance by use of the silicide layer beneath the upper portion of the T-shaped emitter 800, which increases device speed. The spacer 700 prevents short circuits to maintain high yield and reliability. The first embodiment shown in FIGS. 1-8 is more efficient than the second embodiment shown in FIGS. 9-14; however both embodiments produce the benefits of reduced resistance, without affecting yield.

While the invention has been described in terms of preferred embodiments, those skilled in the art will recognize that the invention can be practiced with modification within the spirit and scope of the appended claims.

What is claimed is:

1. A method of making a transistor, said method comprising:
    forming an extrinsic base above an intrinsic base, wherein before forming said extrinsic base:
        patterning an insulator over said center of said intrinsic base; and
        epitaxially growing said extrinsic base over said insulator and said intrinsic base;
    protecting a portion of said extrinsic base using a sacrificial mask that is positioned over a center of said extrinsic base;
    siliciding exposed portions of said extrinsic base, wherein said siliciding process leaves a non-silicided portion over said center of said extrinsic base;
    forming an emitter opening though a center of said non-silicided portion of said extrinsic base;
    forming spacers in said emitter opening; and
    forming an emitter in said emitter opening, wherein said spacers separate said emitter from silicided portions of said extrinsic base.

2. The method in claim 1, wherein said process of epitaxially growing said extrinsic base grows polysilicon above said insulator and single crystal silicon above the exposed portions of said intrinsic base.

3. The method in claim 1, wherein said spacers are formed on said insulator.

4. The method in claim 1, wherein said siliciding process forms said silicided portions of said extrinsic base horizontally adjacent to said non-silicided portion.

5. The method in claim 1, further comprising, before forming said emitter opening, forming an insulator layer above said extrinsic base, wherein said emitter opening is formed though said insulator layer.

6. A method of making a transistor, said method comprising:
    forming a lower semiconductor structure having a first-type impurity;
    forming a middle semiconductor region above said lower semiconductor structure, said middle semiconductor region having a second-type impurity complementary to said first-type impurity, wherein before forming said middle semiconductor region:
        forming a silicon layer over said lower semiconductor structure;
        patterning an insulator over said center of said silicon layer; and
        epitaxially growing said middle semiconductor region over said insulator and said silicon layer;
    protecting a portion of said middle semiconductor region using a sacrificial mask that is positioned over a center of said middle semiconductor region;
    siliciding exposed portions of said middle semiconductor region, wherein said siliciding process leaves a non-silicided portion over said center of said middle semiconductor region;
    forming an upper semiconductor structure opening though a center of said non-silicided portion of said middle semiconductor region;
    forming spacers in said upper semiconductor structure opening; and
    forming an upper semiconductor structure in said upper semiconductor structure opening, wherein said spacers separate said upper semiconductor structure from silicided portions of said middle semiconductor region.

7. The method in claim 6, wherein said process of epitaxially growing said middle semiconductor region grows polysilicon above said insulator and single crystal silicon above the exposed portions of said silicon layer.

8. The method in claim 6, wherein said spacers are formed on said insulator.

9. The method in claim 6, wherein said siliciding process forms said silicided portions of said middle semiconductor region horizontally adjacent to said non-silicided portion.

10. The method in claim 6, further comprising, before forming said upper semiconductor structure opening, forming an insulator layer above said middle semiconductor region, wherein said upper semiconductor structure opening is formed though said insulator layer.

11. A method of making a bipolar complementary metal oxide semiconductor (BiCMOS) device, said method comprising:
    forming a collector;
    forming shallow trench isolation regions adjacent said collector;
    forming an intrinsic base above said collector;
    forming a raised extrinsic base above said intrinsic base, wherein before forming said extrinsic base:
        patterning an insulator over said center of said intrinsic base; and
        epitaxially growing said extrinsic base over said insulator and said intrinsic base;

protecting a portion of said extrinsic base using a sacrificial mask that is positioned over a center of said extrinsic base;

siliciding exposed portions of said extrinsic base, wherein said siliciding process leaves a non-silicided portion over said center of said extrinsic base;

forming an emitter opening though a center of said non-silicided portion of said extrinsic base;

forming spacers in said emitter opening; and forming an emitter in said emitter opening, wherein said spacers separate said emitter from silicided portions of said extrinsic base.

12. The method in claim 11, wherein said process of epitaxially growing said extrinsic base grows polysilicon above said insulator and single crystal silicon above the exposed portions of said intrinsic base.

13. The method in claim 11, wherein said siliciding process forms said silicided portions of said extrinsic base horizontally adjacent to said non-silicided portion.

14. The method in claim 11, wherein said spacers are formed on said insulator.

* * * * *